(12) United States Patent
Zang et al.

(10) Patent No.: US 9,601,512 B2
(45) Date of Patent: Mar. 21, 2017

(54) SOI-BASED SEMICONDUCTOR DEVICE WITH DYNAMIC THRESHOLD VOLTAGE

(71) Applicant: GLOBALFOUNDRIES Inc., Grand Caymay (KY)

(72) Inventors: Hui Zang, Guilderland, NY (US); Manfred Eller, Beacon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/801,519

(22) Filed: Jul. 16, 2015

(65) Prior Publication Data
US 2017/0018573 A1    Jan. 19, 2017

(51) Int. Cl.
| | |
|---|---|
| H01L 21/8238 | (2006.01) |
| H01L 27/092 | (2006.01) |
| H01L 27/12 | (2006.01) |
| H01L 21/84 | (2006.01) |
| H01L 29/66 | (2006.01) |

(52) U.S. Cl.
CPC ...... H01L 27/1203 (2013.01); H01L 21/8238 (2013.01); H01L 21/84 (2013.01); H01L 27/092 (2013.01); H01L 29/66553 (2013.01)

(58) Field of Classification Search
CPC .............. H01L 27/1203; H01L 27/092; H01L 27/0825; H01L 27/0928; H01L 27/11807; H01L 2027/11861; H01L 21/84; H01L 21/8238; H01L 21/823814; H01L 21/823892; H01L 21/743; H01L 21/74; H01L 29/66553

See application file for complete search history.

(56) References Cited

U.S. PATENT DOCUMENTS

| | | | | |
|---|---|---|---|---|
| 6,465,823 B1 * | 10/2002 | Yagishita | .......... | H01L 29/42384 257/288 |
| 6,509,615 B2 * | 1/2003 | Iwata | ................ | H01L 21/76229 257/368 |

(Continued)

OTHER PUBLICATIONS

Inukai, et al., "Variable Threshold Voltage CMOS (VTCMOS) in Series Connected Circuits," Institute of Industrial Science, University of Tokyo, 2001, pp. 201-206.

*Primary Examiner* — Galina Yushina
(74) *Attorney, Agent, or Firm* — Wayne F. Reinke, Esq.; Heslin Rothenberg Farley & Mesiti P.C.

(57) ABSTRACT

A semiconductor device includes a semiconductor substrate, an insulating layer on a top surface of the substrate, and a first semiconductor transistor on the insulating layer, the transistor including an active region with a source region, a drain region, a channel region between the source and drain regions and a gate structure over the channel region, the gate structure extending beyond the transistor to an adjacent area. An outer well is included in the substrate, an inner well of an opposite type as the outer well situated within the outer well and under the active region and adjacent area, and a contact for the inner well in the adjacent area, the contact surrounding the gate structure. Operating the device includes applying a variable voltage at the contact for the inner well, a threshold voltage for the first transistor being altered by the variable voltage. The inner well and gate may be exposed and contacts created therefor together.

17 Claims, 5 Drawing Sheets

(56) References Cited

U.S. PATENT DOCUMENTS

| | | | |
|---|---|---|---|
| 6,876,055 B2 * | 4/2005 | Iwata | H01L 21/761 257/510 |
| 2006/0027877 A1 * | 2/2006 | Inaba | H01L 21/823892 257/371 |

* cited by examiner

SOI-BASED SEMICONDUCTOR DEVICE WITH DYNAMIC THRESHOLD VOLTAGE

BACKGROUND OF THE INVENTION

Technical Field

The present invention generally relates to silicon-on-insulator based semiconductor devices. More particularly, the present invention relates to the integration of a dynamic threshold voltage capability into semiconductor fabrication, and resulting devices.

Background Information

Short-channel effects have been a source of performance degradation in semiconductor device fabrication, and as such devices continue to shrink, effectively combating short-channel effects becomes more difficult. Compared to a conventional FinFET process, silicon-on-insulator (SOI) technology with "ultra-thin-body (UTB)," referring to the body of the substrate, has done well in reducing short-channel effects. UTB technology has also been used to achieve multiple threshold voltage devices with a back-gate strategy. However, the threshold voltages are fixed.

Thus, a need continues to exist for a SOI-based strategy with improved multi-threshold voltage capability.

SUMMARY OF THE INVENTION

The shortcomings of the prior art are overcome and additional advantages are provided through the provision, in one aspect, of a semiconductor device. The semiconductor device includes a semiconductor substrate, an insulating layer on a top surface of the substrate, and a first semiconductor transistor on the insulating layer, the transistor comprising an active region with a source region, a drain region, a channel region between the source and drain regions and a gate structure over the channel region, the gate structure extending beyond the active region to an adjacent area and including spacers and a gate electrode. The semiconductor device further comprises an outer well in the substrate, an inner well situated within the outer well and having a conductivity type opposite to that of the outer well, the inner well also situated under the active region and the adjacent area, and a contact for the inner well in the adjacent area, the contact wrapping around sides and a top of a portion of the gate electrode in the adjacent area.

In accordance with another aspect, a method of operating a semiconductor device is provided. The method comprises providing a semiconductor device of the first aspect, the device comprising: a semiconductor substrate, an insulating layer on a top surface of the substrate, and a first semiconductor transistor on the insulating layer, the transistor comprising an active region with a source region, a drain region, a channel region between the source and drain regions and a gate structure over the channel region, the gate structure extending beyond the transistor to an adjacent area. The device further comprises an outer well in the substrate, an inner well of an opposite type than and situated within the outer well and under the active region and adjacent area, and a contact for the inner well in the adjacent area, the contact surrounding the gate structure. The method further comprises applying a variable voltage at the contact for the inner well, a threshold voltage for the first transistor being altered by the variable voltage.

In accordance with yet another aspect is a method. The method comprises providing a semiconductor structure, the structure comprising a semiconductor substrate, an insulating layer on a top surface of the substrate, and a first semiconductor transistor on the insulating layer, the transistor comprising an active region with a source region, a drain region, a channel region between the source and drain regions and a gate structure over the channel region, the gate structure extending beyond the transistor to an adjacent area. The semiconductor structure provided further comprises an outer well in the substrate, and an inner well of an opposite type than and situated within the outer well and under the active region and adjacent area. The method further comprises forming a blanket dielectric layer over the semiconductor structure provided, exposing the gate structure and the inner well adjacent to each spacer of the gate structure, and forming contacts to the inner well and to the gate simultaneously, the inner well contact surrounding the gate structure in the adjacent area.

These, and other objects, features and advantages of this invention will become apparent from the following detailed description of the various aspects of the invention taken in conjunction with the accompanying drawings.

DETAILED DESCRIPTION OF THE INVENTION

Figure 1:
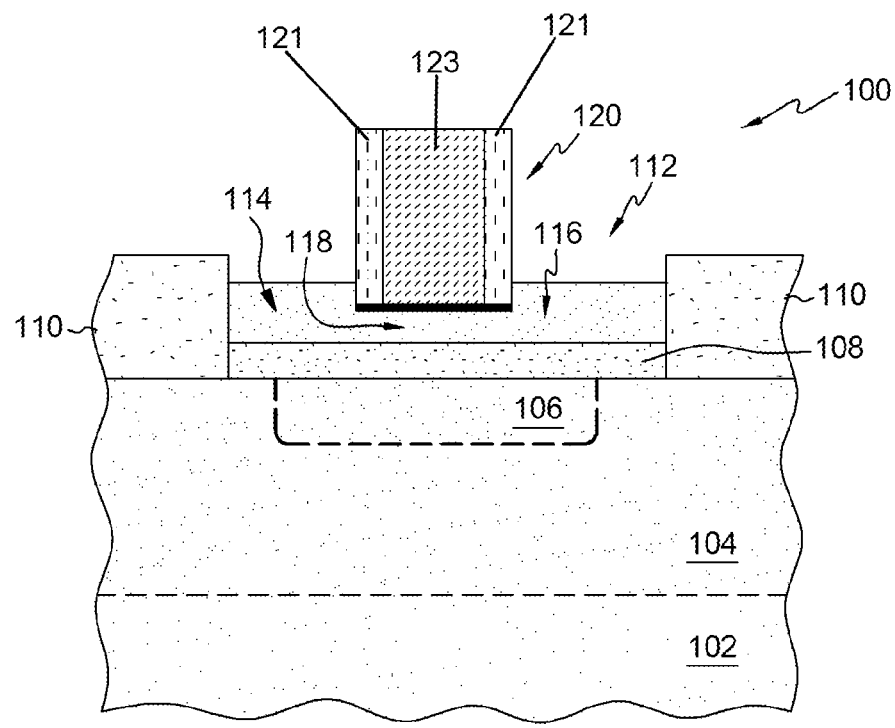
FIG. 1 is a cross-sectional view of one example of a starting semiconductor structure, the structure including a semiconductor substrate, an outer well, an inner well having a conductivity type opposite to that of the outer well, a first layer of isolation material and a second layer of device-separating isolation material, an active layer including a source region, a drain region and a channel region therebetween and under a gate structure, the gate structure including spacers and a gate electrode, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting semiconductor structure 100, the structure including a semiconductor substrate 102, an outer well 104 of n-type or p-type, an inner well 106 of the opposite type to the outer well, a first layer 108 of isolation material and a second layer 110 of device isolation material (e.g., an oxide), an active layer 112 including a source region 114, a drain region 116 and a channel region 118 therebetween and under gate structure 120, the gate structure including spacers 121 and a gate electrode 123, in accordance with one or more aspects of the present invention.

The starting structure may be conventionally fabricated, for example, using known processes and techniques (e.g., implantation, etching, etc.). Further, unless noted otherwise, conventional processes and techniques may be used to achieve individual steps of the fabrication process of the present invention. However, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof an alloy semiconductor including GaAsP, AlInAs, GaInAs, GaInP, or GaInAsP or combinations thereof.

Figure 2:
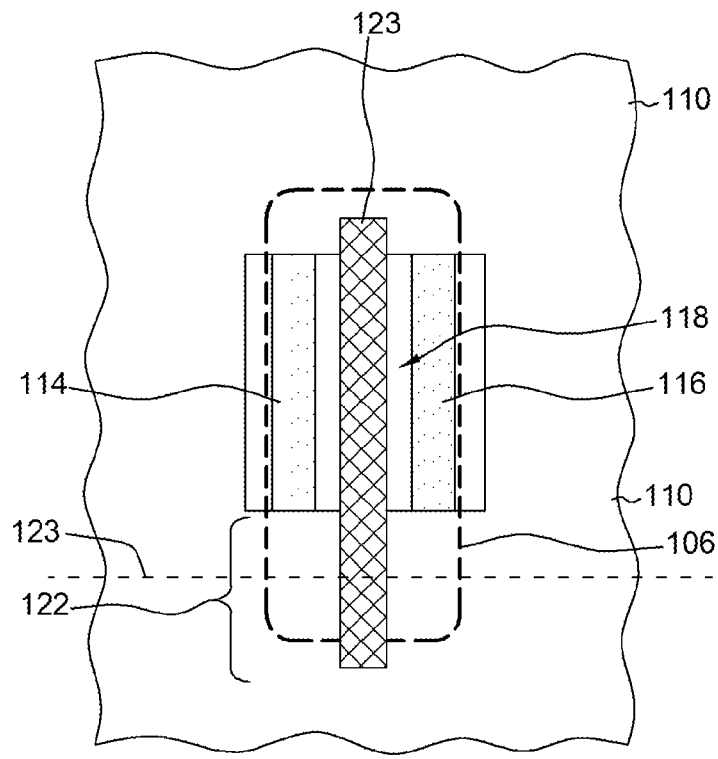
FIG. 2 is one example of a top-down view of the structure of FIG. 1 after silicidation of the source and drain, and metal contacts are formed for the source and drain, the gate and the inner well extending beyond the active layer to an adjacent area, in accordance with one or more aspects of the present invention.

FIG. 2 is one example of a top-down view of the structure of FIG. 1 after silicidation and contact formation for the source and drain, showing the gate structure 120 and the inner well 106 extending beyond the active layer 112 to an adjacent area 122, in accordance with one or more aspects of the present invention.

Figure 3:
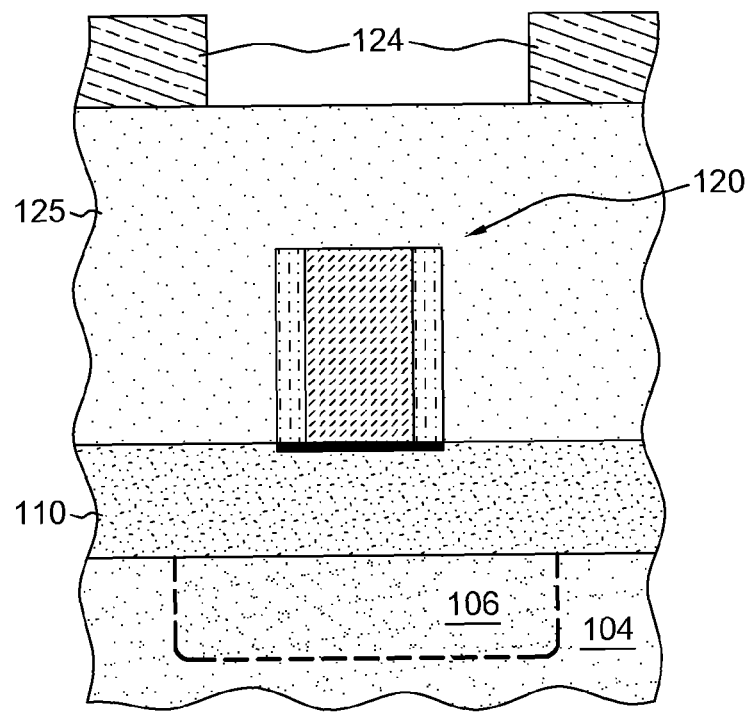
FIG. 3 is a cross-sectional view of one example of the structure of FIGS. 1 and 2 after formation of a blanket dielectric layer and lithography, the lithographic blocking layer (e.g., photoresist) remaining, in accordance with one or more aspects of the present invention.

FIG. 3 is a cross-sectional view of one example of the structure of FIGS. 1 and 2, taken across line 123 in FIG. 2, after formation of a blanket dielectric layer 125 and lithography, lithographic blocking layer 124 (in this example, photoresist) remaining, in accordance with one or more aspects of the present invention.

In one example, the blanket dielectric layer may include, for example, silicon dioxide ($SiO_2$) or a low-k dielectric (i.e., dielectric constant of less than $SiO_2$), and the material of the lithographic blocking layer may be, for example, photo resist. Further, one skilled in the art will understand that the lithographic blocking layer is initially blanket and sections thereof removed after patterned light exposure.

Figure 4:
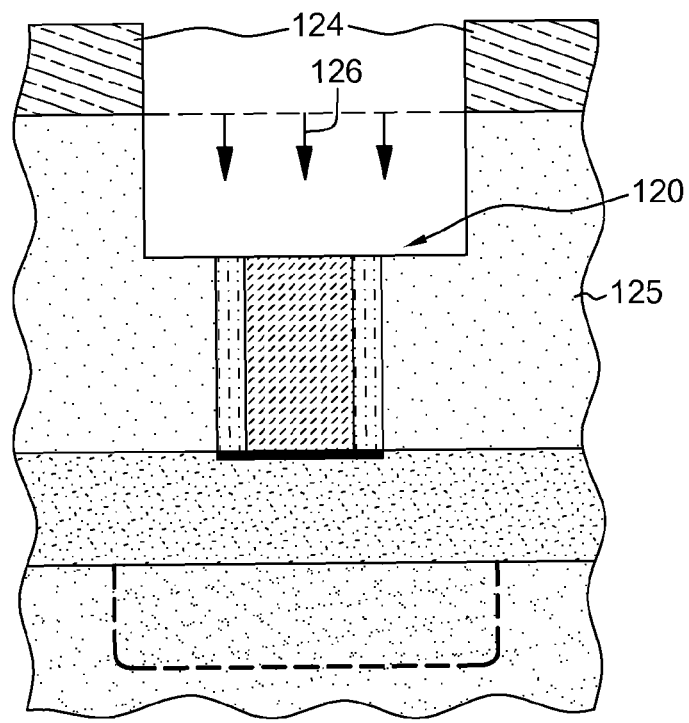
FIG. 4 is one example of the structure of FIG. 3 after partial removal of the blanket dielectric layer above the gate structure, in accordance with one or more aspects of the present invention.

FIG. 4 is one example of the structure of FIG. 3 after partial removal 126 of the blanket dielectric layer 125 above the gate structure 120, in accordance with one or more aspects of the present invention.

Partial removal of the blanket dielectric layer may be accomplished, for example, by etching and using one or more portions of the gate structure as a stop.

Figure 5:
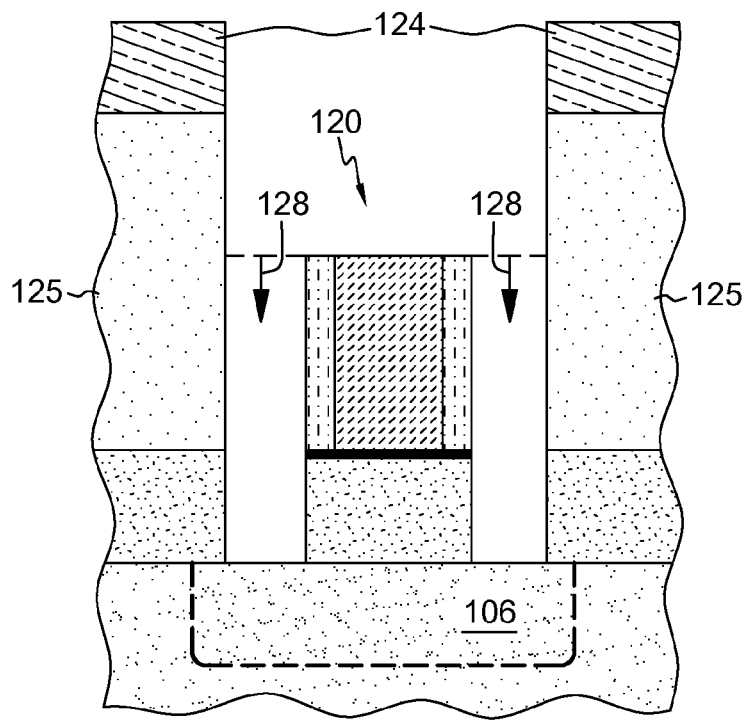
FIG. 5 is one example of the structure of FIG. 4 after continued partial removal of the blanket dielectric layer on both sides of the gate structure in the adjacent area, stopping on and exposing the inner well, in accordance with one or more aspects of the present invention.

FIG. 5 is one example of the structure of FIG. 4 after continued partial removal 128 of the blanket dielectric layer 125 on both sides of the gate structure 120 in the adjacent area (122, FIG. 2), stopping on and exposing the inner well 106, in accordance with one or more aspects of the present invention.

Figure 6:
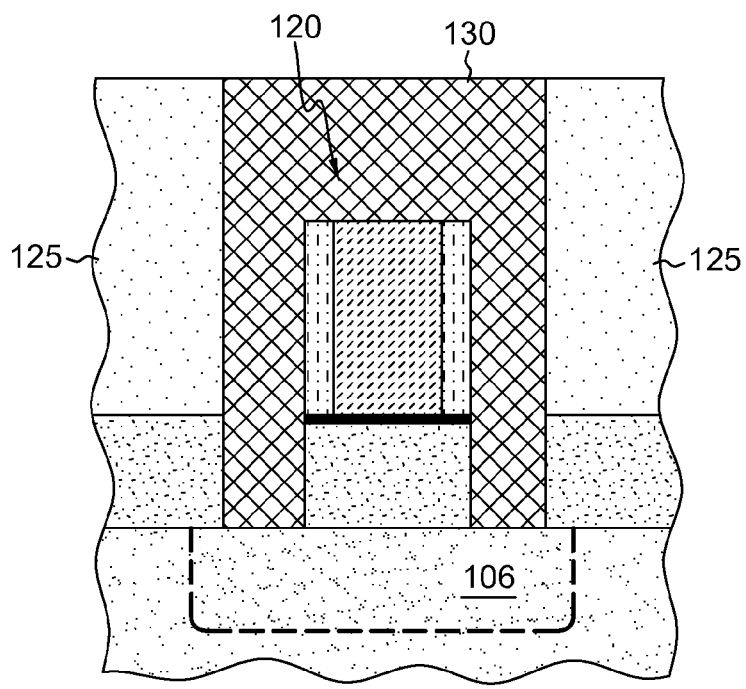
FIG. 6 is one example of the structure of FIG. 5 after removal of the remaining lithographic blocking material and formation of a contact to the inner well that wraps around the gate structure, in accordance with one or more aspects of the present invention.

FIG. 6 is one example of the structure of FIG. 5 after removal of the remaining lithographic blocking material and formation of a contact 130 to the inner well 106, the contact wrapping around sides and top of a portion of the gate electrode 123 in adjacent area 122, in accordance with one or more aspects of the present invention.

The material of the contact includes a conductive material, for example, a metal. Formation of the contact may be accomplished, for example, by filling with the conductive material, followed by removal of excess conductive material (e.g., using a chemical-mechanical polish stopping on dielectric layer 125).

Figure 7:
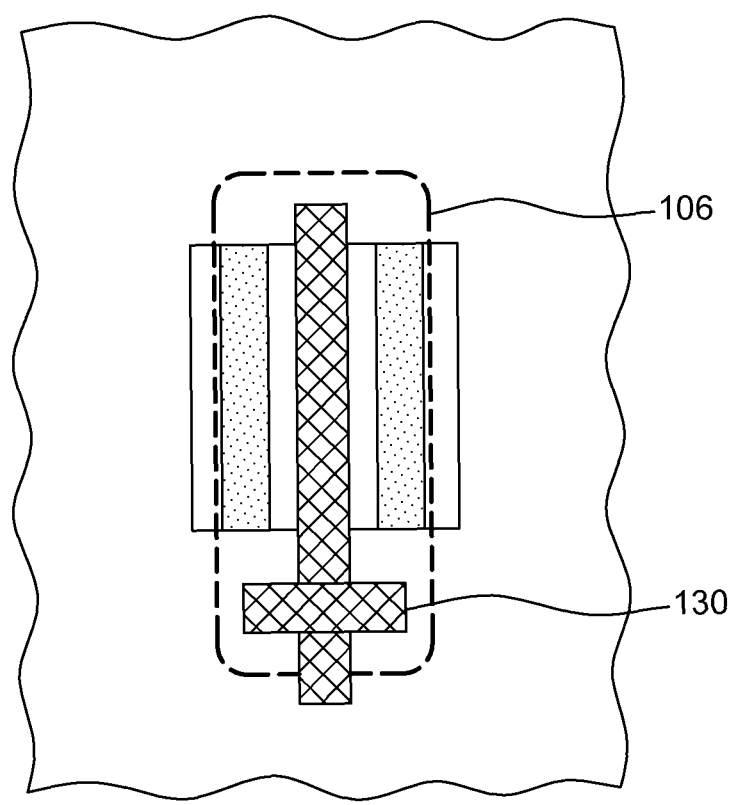
FIG. 7 is a top-down view of one example of the structure of FIG. 6 more clearly showing the inner well contact in the context of the overall structure, in accordance with one or more aspects of the present invention.

FIG. 7 is a top-down view of one example of the structure of FIG. 6 more clearly showing inner well contact 130 in the context of the overall structure, in accordance with one or more aspects of the present invention.

In one example, the inner well contact 130 may be a same conductive material as that of the gate contact. In another example, the source and drain contacts may also be the same conductive material as the gate and inner well contacts (e.g., tungsten). In the case where they are all the same conductive material, lithography followed by etching may be used to open the source and drain, gate and inner well, followed by simultaneous filling with the conductive material, with a planarization process to follow (e.g., a chemical-mechanical polish).

Figure 8:
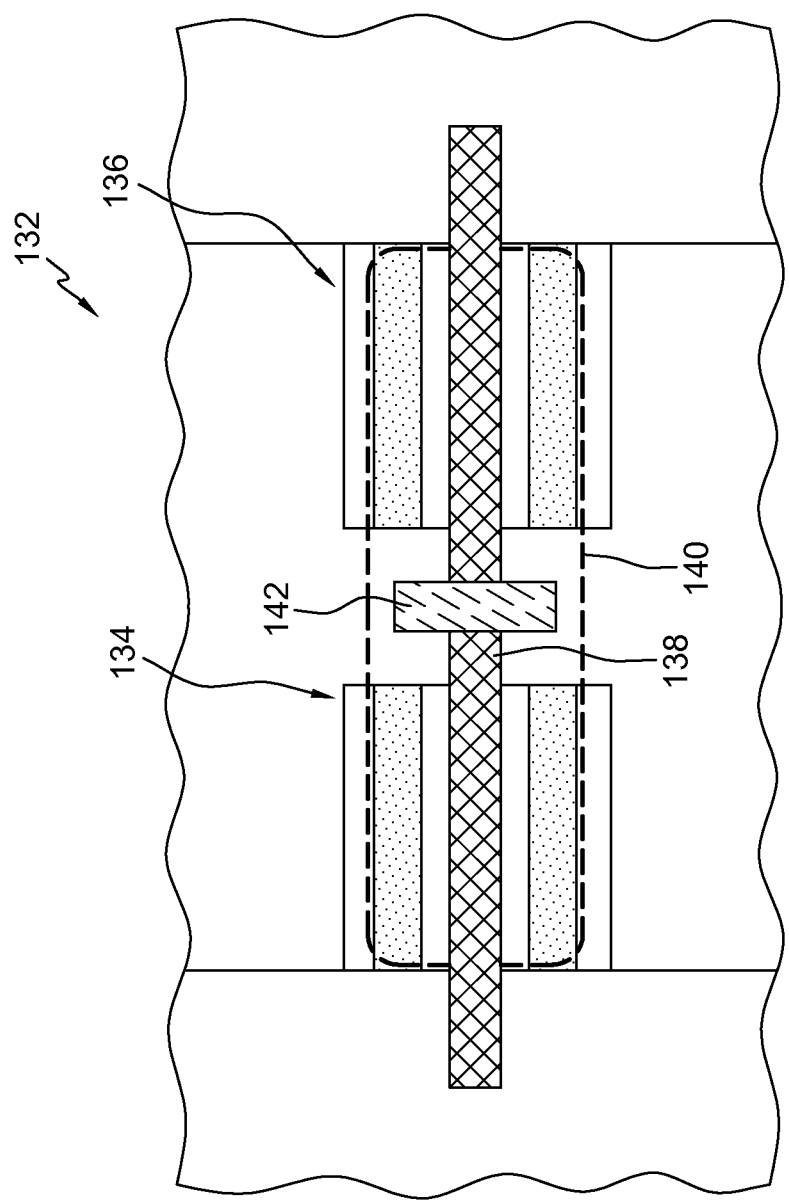
FIG. 8 is a top-down view of one example of a CMOS device, one transistor being n-type and the other p-type, with a shared gate structure and shared inner well with a shared contact to the inner well between the two transistors, in accordance with one or more aspects of the present invention.

FIG. 8 is a top-down view of one example of a dual transistor device 132, one transistor (e.g., transistor 134) being n-type and the other (here, transistor 136) p-type (note the n and p type transistors can be switched), with a shared gate structure 138 and shared inner well 140 with a shared contact 142 to the inner well between the two transistors, in accordance with one or more aspects of the present invention.

In one example, the device of FIG. 8 is used as a logic inverter. Inner well 140 includes, for example, an n-type impurity. Where the gate 138 voltage is positive, the n-type transistor will see a threshold voltage decrease and a higher drive current, whereas the threshold voltage for the p-type transistor will increase, reducing the off leakage current (only one transistor is on at a given time). Conversely, a negative gate voltage will decrease the p-type threshold voltage and increase the n-type threshold voltage, giving a higher drive current for the p-type transistor and lower off leakage current for the p-type transistor.

In a first aspect, disclosed above is a semiconductor device. The semiconductor device includes a semiconductor substrate, an insulating layer on a top surface of the substrate, and a first semiconductor transistor on the insulating layer, the transistor including an active region with a source region, a drain region, a channel region between the source and drain regions and a gate structure over the channel region, the gate structure extending beyond the transistor to an adjacent area. The semiconductor device further includes an outer well in the substrate, an inner well of an opposite type of and situated within the outer well and under the active region and adjacent area, and a contact for the inner well in the adjacent area, the contact surrounding the gate structure.

In one example, the inner well contact may be, for example, in direct contact with a gate of the gate structure. In one example, where the direct contact is present, the semiconductor device may include, for example, a complementary metal-oxide semiconductor (CMOS) device.

In one example, the substrate of the first aspect may include, for example, a lower body having a thickness of about 1 nm to about 30 nm, and preferably from about 5 nm to about 10 nm.

In one example, the semiconductor device of the first aspect may further include, for example, a second semiconductor transistor of a type opposite the first transistor on the insulating layer, the gate structure being shared by the first and second transistors, the adjacent area and inner well contact being situated between the first and second transistors, and the inner well extending under both transistor active regions and the adjacent area.

In one example, where the second transistor is present, the device may take the form of, for example, a dynamic threshold voltage logic inverter.

In a second aspect, disclosed above is a method of operating a semiconductor device. The method includes providing a semiconductor device, the device including: a semiconductor substrate, an insulating layer on a top surface of the substrate, and a first semiconductor transistor on the insulating layer, the transistor including an active region with a source region, a drain region, a channel region between the source and drain regions and a gate structure over the channel region, the gate structure extending beyond the transistor to an adjacent area. The device further includes an outer well in the substrate, an inner well of an opposite type as the outer well and situated within the outer well and under the active region and adjacent area, and a contact for the inner well in the adjacent area, the contact surrounding the gate structure. The method further includes applying a variable voltage at the contact for the inner well, a threshold voltage for the first transistor being altered by the variable voltage.

In one example, where the first transistor is n-type, applying the variable voltage may include, for example, applying a positive bias to the inner well contact to reduce the threshold voltage. In another example, where the first transistor is n-type, applying the variable voltage may include, for example, applying a negative bias to the inner well contact to increase the threshold voltage.

In one example, where the first transistor is p-type, applying the variable voltage may include, for example, applying a positive bias to the inner well contact to increase the threshold voltage. In another example, where the first transistor is p-type, applying the variable voltage may include, for example, applying a negative bias to the inner well contact to reduce the threshold voltage.

In one example, the device provided in the method of the second aspect may further include, for example, a second semiconductor transistor of a type opposite the first transistor on the insulating layer, the gate structure being shared by the first and second transistors, the adjacent area and inner well contact being situated between the first and second transistors, the inner well extending under both transistor active regions and the adjacent area, and applying the variable voltage may include, for example, applying a positive bias, the positive bias reducing the threshold voltage for one of the first transistor and second transistor and increasing a threshold voltage for the other of the first transistor and second transistor.

In one example, the device provided in the method of the second aspect may further include a second transistor of a conductivity type opposite to that of the first transistor on the insulating layer, the gate structure being shared by the first and second transistors, the adjacent area and inner well contact being situated between the first and second transistors, the inner well extending under both transistor active regions and the adjacent area, and applying the variable voltage may include, for example, applying a negative bias, the negative bias increasing the threshold voltage for one of the first transistor and second transistor and decreasing a threshold voltage for the other of the first transistor and second transistor.

In a third aspect, disclosed above is a method. The method includes providing a semiconductor structure, the structure including a semiconductor substrate, an insulating layer on a top surface of the substrate, and a first semiconductor transistor on the insulating layer, the transistor including an active region with a source region, a drain region, a channel region between the source and drain regions and a gate structure over the channel region, the gate structure extending beyond the transistor to an adjacent area. The structure provided further includes an outer well in the substrate, and an inner well of an opposite type as the outer well situated within the outer well and under the active region and adjacent area. The method further includes forming a blanket dielectric layer over the semiconductor structure provided, exposing the gate structure and the inner well adjacent to each spacer of the gate structure, and forming contacts to the inner well and to the gate simultaneously, the inner well contact surrounding the gate structure in the adjacent area.

In one example, exposing the gate structure and the inner well may include, for example, removing a portion of the blanket dielectric layer and stopping on the gate structure, the portion being less wide than the inner well and wider than the gate structure, exposing the gate structure, and removing portions of the blanket dielectric layer and the insulating layer below and adjacent the spacers to expose the inner well.

In one example, forming the contacts to the inner well and gate in the method of the third aspect may include, for example, simultaneously filling open areas adjacent the spacers and above the gate structure created by the exposing.

In one example, where the open areas are simultaneously filled, the method may include, for example, prior to forming the inner well and gate contacts, exposing the source region and the drain region, and simultaneously forming contacts to the source and drain regions with the inner well and gate contacts.

In one example, the semiconductor structure provided in the method of the third aspect may further include, for example, contacts to the source region and the drain region.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor device, comprising:
   a semiconductor substrate;
   an insulating layer on a top surface of the substrate;
   a first semiconductor transistor on the insulating layer, the transistor comprising an active region with a source region, a drain region, a channel region between the source and drain regions and a gate structure over the channel region, the gate structure extending beyond the active region to an adjacent area and comprising spacers and a gate electrode;
   an outer well in the substrate;
   an inner well situated within the outer well and having a conductivity type opposite to that of the outer well, the inner well also situated under the active region and the adjacent area; and
   a contact for the inner well in the adjacent area, wherein the contact wraps around sides and a top of a portion of the gate electrode in the adjacent area.

2. The semiconductor device of claim 1, wherein the inner well contact is in direct contact with a gate of the gate structure.

3. The semiconductor device of claim 2, wherein the semiconductor device comprises a complementary metal-oxide semiconductor (CMOS) device.

4. The semiconductor device of claim 1, further comprising a second semiconductor transistor of a conductivity type opposite to that of the first transistor on the insulating layer, wherein the gate structure is shared by the first and second transistors, wherein the adjacent area and the inner well contact are situated between the first and second transistors, and wherein the inner well extends under active regions of both transistors and under the adjacent area.

5. The semiconductor device of claim 4, wherein the device comprises a dynamic threshold voltage logic inverter.

6. A method, comprising:
   providing a semiconductor device comprising:
   a semiconductor substrate;
   an insulating layer on a top surface of the semiconductor substrate;
   a first semiconductor transistor on the insulating layer, the first transistor comprising an active region with a source region, a drain region,
   a channel region between the source and drain regions and a gate structure over the channel region, the gate structure extending beyond the active region to an adjacent area and comprising a gate spacers and a gate electrode;
   an outer well in the substrate;
   an inner well situated within the outer well and having a conductivity type opposite to that of the outer well, the inner well also situated under the active region and the adjacent area;
   a contact for the inner well in the adjacent area, wherein the contact wraps around a top surface and sides of the gate electrode in the adjacent area; and
   applying a variable voltage at the contact for the inner well, a threshold voltage for the first transistor being altered by the variable voltage.

7. The method of claim 6, wherein the first transistor is an n-type transistor, and wherein applying the variable voltage comprises applying a positive bias to reduce the threshold voltage.

8. The method of claim 6, wherein the first transistor is an n-type transistor, and wherein applying the variable voltage comprises applying a negative bias to increase the threshold voltage.

9. The method of claim 6, wherein the first transistor is a p-type transistor, and wherein applying the variable voltage comprises applying a positive bias to increase the threshold voltage.

10. The method of claim 6, wherein the first transistor is a p-type transistor, and wherein applying the variable voltage comprises applying a negative bias to decrease the threshold voltage.

11. The method of claim 6, wherein the semiconductor device further comprises a second semiconductor transistor on the insulating layer, the second semiconductor transistor having a conductivity type of an active region opposite to that of the first transistor, wherein the gate structure is shared by the first and second transistors, wherein the adjacent area and inner well contact are situated between the first and second transistors, wherein the inner well extends under active regions of both transistors and the adjacent area, and wherein applying the variable voltage comprises applying a positive bias, the positive bias reducing the threshold voltage for one of the first transistor and second transistor and increasing a threshold voltage for the other of the first transistor and second transistor.

12. The method of claim 6, wherein the semiconductor device further comprises a second semiconductor transistor on the insulating layer, the second semiconductor transistor having a conductivity type of an active region opposite to that of the first transistor, wherein the gate structure is shared by the first and second transistors, wherein the adjacent area and inner well contact are situated between the first and second transistors, wherein the inner well extends under both transistor active regions and the adjacent area, and wherein applying the variable voltage comprises applying a negative bias, the negative bias increasing the threshold voltage for one of the first transistor and second transistor and decreasing a threshold voltage for the other of the first transistor and second transistor.

13. A method, comprising:
   providing a semiconductor structure comprising:
   a semiconductor substrate;
   an insulating layer on a top surface of the semiconductor substrate;
   a first semiconductor transistor on the insulating layer, the first transistor comprising an active region with a source region, a drain region, a channel region between the source and drain regions and a gate structure over the channel region, the gate structure extending beyond the active region to an adjacent area and comprising gate spacers and a gate electrode;
   an outer well in the substrate; and
   an inner well situated within the outer well and having a conductivity type opposite to that of the outer well, the inner well also situated under the active region and the adjacent area;
   forming a blanket dielectric layer over the semiconductor structure provided;
   exposing the gate structure and portions of the inner well adjacent to each gate spacer by etching portions of the blanket dielectric layer and the insulating layer; and
   forming contacts to the inner well and to the gate electrode simultaneously, the contact wrapping around a top surface and sides of the gate electrode in the adjacent area, the contact also touching a top surface of the inner well by reaching the inner well with a wrapping material.

14. The method of claim 13, wherein exposing the gate structure and the inner well portions comprises:
   removing a portion of the blanket dielectric layer by etching to expose a top of the gate structure such that an opening in the blanket dielectric layer is created, the opening being less wide than the inner well and wider than the gate structure; and
   removing additional portions of the blanket dielectric layer and the insulating layer adjacent the gate spacers to expose the inner well.

15. The method of claim 13, wherein forming the contacts to the inner well and gate electrode comprises simultaneously filling open areas of the blanket dielectric layer adjacent the gate spacers and above the top of gate structure created by the exposing.

16. The method of claim 15, further comprising, prior to forming the inner well and gate electrode contacts, exposing the source region and the drain region, and simultaneously forming contacts to the source and drain regions with the inner well and gate contacts.

17. The method of claim 13, wherein the provided semiconductor structure further comprises contacts to the source region and the drain region.

* * * * *